United States Patent

Hogya et al.

[15] 3,644,155

[45] Feb. 22, 1972

[54] CLEANING AND BRIGHTENING OF LEAD-TIN ALLOY-RESISTED CIRCUIT BOARDS

[72] Inventors: Bernard James Hogya, Sayreville, N.J.; Joseph Thomas McManamon, Levittown, Pa.

[73] Assignee: FMC Corporation, New York, N.Y.

[22] Filed: May 1, 1969

[21] Appl. No.: 821,088

[52] U.S. Cl. ....................156/20, 134/3, 134/41, 156/3, 156/13, 156/18

[51] Int. Cl. ....................C23g 1/06, C23f 3/04

[58] Field of Search ....................252/79.2, 79.4, 146, 142, 151; 156/20, 18, 3; 134/3, 28, 41; 204/140.5; 75/166

[56] References Cited

UNITED STATES PATENTS

| | | | |
|---|---|---|---|
| 2,485,529 | 10/1949 | Cardwell et al. | 252/149 |
| 3,136,670 | 6/1964 | Rogers et al. | 252/79.4 |
| 3,409,487 | 11/1968 | Fry et al. | 156/13 |
| 3,476,624 | 11/1969 | Hogya et al. | 156/18 |

FOREIGN PATENTS OR APPLICATIONS

| | | |
|---|---|---|
| 10,058 | 11/1959 | Japan |

OTHER PUBLICATIONS

Chemical Abstracts (53) (1959) 1790e. Wada " Paste for Cleaning Pewter"

" Thioures and its Derivatives as Corrosion Inhibitors" Desai et al., Anti- Corrosion July 1968 pp. 12- 15 inclusive.

*Primary Examiner*—Robert F. Burnett

*Assistant Examiner*—R. J. Roche

*Attorney*—Eugene G. Seems, Frank Ianno and Milton Zucker

[57] ABSTRACT

Etched copper circuits having a solder-plated resist are cleaned and brightened by contacting the solder surface with hydrobromic acid.

6 Claims, No Drawings

CLEANING AND BRIGHTENING OF LEAD-TIN ALLOY-RESISTED CIRCUIT BOARDS

BACKGROUND OF THE INVENTION

1. Field of the Invention

This invention relates to the cleaning of etched circuit boards having copper circuits with an overlay of a lead-tin alloy as a resist.

2. Description of the Prior Art

It is known that printed electrical circuit boards can be produced by applying a resist or mask in the form of the desired circuit over the surface of a metal film, e.g., copper, laminated to a base, and then treating the masked copper film with an etchant. The copper area not covered by the resist or mask is dissolved, while the copper covered by the resist remains to form the desired circuit. If a lead-tin alloy (commonly termed "solder") is used as the resist, the resulting "printed circuit" has a copper layer in the form of the printed circuit adhered to a nonconductive base with an overlay of lead-tin (solder) alloy.

Ammonium persulfate solutions are desirable as the etchant in such processing because they do not generate obnoxious fumes, are easy to work with and are relatively noncorrosive to certain common metals of construction, such as stainless steel. Other etchants that are also used in the production of printed circuit boards include chromic acid, chromic acid-sulfuric acid, alkaline sodium chlorate, and the like.

These etchants, and particularly persulfates, have one serious disadvantage. In the production of printed circuits in which lead-tin alloys (solder) are employed as resists, it is desired that the solder resist be clean and bright so that the solder which remains on the circuit can be easily connected, for example by dip-soldering, to other circuit elements. However, when etching is carried out with persulfates and other such etchants, the lead-tin resist is discolored in spots and darkened (termed "mottling") and often a white powdery deposit forms on the surface of the solder. This, of course, means that an additional operation must be carried out to remove these deposits and discolorations; if they are not so removed, the resulting printed circuit has a surface which is not electrically clean, and which eventually may cause corrosion of the system in which the printed circuit is employed. Furthermore, the appearance of the solder-plated circuit is so unattractive that producers of electrical finished products will not employ them.

Several means of removing these deposits and discolorations have been devised. One involves treating the effected solder with an aqueous hydrochloric acid solution to loosen foreign matter, and thereafter mechanically abrading the loosened material with a wire brush, or the like, to remove it. This process involves both the chemical and mechanical treatment; neither the hydrochloric acid, nor the abrasion treatment by itself removes the deposits and overcomes the discoloration. This combination process has not been unacceptable to the trade.

Another cleaning technique which has been found operative is set forth in U.S. Pat. No. 3,181,984, issued to William J. Tillis on May 4, 1965. In this process the etched, solder-resist printed circuit is dipped in a solution containing fluoboric acid and thiourea. This dip requires on the order of about 2 minutes, although cleaning of nonsevere discoloration can be carried out in as little as 45 seconds. Further, the treating bath preferably is maintained at temperatures of 100°–130° F., although baths as low as 90° F. can be utilized.

OBJECTS OF THE INVENTION

It is an object of the present invention to provide a simple process which will clean and brighten etched printed circuits in a short time (a matter of a few seconds) and at low operating temperatures.

It is a further object of the present invention to describe a process for cleaning etched, solder-resisted printed circuits which will clean and brighten the solder-resist to a point that it is clean and shiny and ready for soldering or otherwise affixing to electrical components.

These and other objects will be apparent from the following description.

SUMMARY OF THE INVENTION

We have now found that solder-resisted printed circuits which have been etched by contact with a copper etchant, preferably ammonium persulfate, can be cleaned and brightened by simple contact of the etched board with an aqueous solution of hydrobromic acid for at least 5 seconds at a temperature of from about 75° F. to the boiling point of the solution. Optionally, thiourea in amounts of 1–20 percent by weight of the cleaning solution can also be used, along with the hydrobromic acid, to obtain the most effective cleaning.

DESCRIPTION OF THE INVENTION AND THE PREFERRED EMBODIMENTS

In carrying out the present invention, a conventional circuit board is produced by placing a solder mask over the surface of a copper film laminated to a nonconductive base. This is then dipped in an etchant for a period sufficient to etch the unmasked portions of the copper. Preferably, the etching is carried out with an aqueous 0.75–1.25 M ammonium persulfate solution and at a temperature of 95° to 135° F. The etching takes place either by conventional immersion etching or by spray etching. In the immersion etching process the masked, copper-coated workpiece is immersed in the solution for the amount of time required to etch the exposed surface. In the spray etching technique the persulfate solution is discharged from a spray nozzle under pressure, and the spray impinges on the masked workpiece. To enhance the rate of etching, the presence of a mercuric salt, as described in U.S. Pat. No. 2,978,301, can also be employed. This conventional, persulfate etching technique produces a darkening of the solder-resist and also may form a white powdery deposit thereon. The darkening is particularly evident when the etching solution contains a substantial amount of copper ions therein.

In accordance with the present invention, the thus etched solder-resisted circuit board is then placed in an aqueous solution of hydrobromic acid at a temperature of anywhere from 75° F. to the boiling point of the hydrobromic acid. The commercially available grade of hydrobromic acid, which is 48 percent by weight HBr in water, is perfectly acceptable without being diluted. If desired, however, the concentration of the HBr can be reduced by dilution so that as little as 0.5 volume percent of the 48 percent HBr is present in an aqueous solution. The etched, solder-resisted circuit board can be immersed for as little as 5 seconds to effect good cleaning. Immersion for longer periods than about 120 seconds does not have any deleterious effect on the process, but is often unnecessary. At higher temperatures and higher concentrations, shorter dip times are required to obtain good cleaning and brightening.

The temperature of the solution may range from about ambient room temperature, i.e., about 75° F., up to the boiling point of the solution. Normally, if the solution is heated, temperatures of up to about 120° F. are sufficient to reduce the treating time to a minimum. Increased temperatures beyond 120° F. may be employed but have no additional benefit. It is preferred to operate within a range of about 75° F. to 120° F. for ease of operation.

In most instances it has been found that the addition of thiourea enhances the etching action when present in amounts of from 1 to 20 percent, based on the weight of solution. While the use of thiourea is not critical with the present hydrobromic acid solution, it is desirable to obtain the best possible results.

The solder which may be treated by the present process comprises from 40–80 percent by weight lead and 60–20 percent by weight tin. The exact ratio of lead to tin in the solder is not critical to the present invention and may vary widely, depending upon the melting point desired for the solder.

The ammonium persulfate etching solutions used in etching the present circuits can also contain additives, such as mercury, sulfuric acid, phosphoric acid and other such additives, to aid in the etching process. These do not hinder in any way the present cleaning and brightening process.

A typical brightening solution for solder-resisted etched circuits is:

| | |
|---|---|
| hydrobromic acid (48% by weight) | 10% by volume of the dip bath |
| thiourea | 10% by weight |

The following examples are given to illustrate the present invention and are not deemed to be limiting thereof.

EXAMPLE 1

A series of runs were made using test circuit boards having dimensions of 2 inches by 3 inches and laminated on one side with 2 ounces per square foot (0.0028 inch thick) of copper. A resist in the form of the desired circuit, made up of 60 percent tin, 40 percent lead alloy (common electrical solder) was plated on the copper of the above circuit boards. These boards were etched in a conventional, ammonium persulfate etching solution containing, per gallon, 2.0 pounds of ammonium persulfate, 3.5 ounces of dissolved copper, 5 p.p.m. of mercury and 1.5 percent by volume of 85 percent phosphoric acid. After etching was completed, the boards were placed in solutions of hydrobromic acid for the periods set forth in Table I. The temperature of the hydrobromic acid was 75° F. The concentrations of the aqueous hydrobromic acid solutions are set forth in Table I. The appearance of the boards after this treatment is also set forth in Table I. The boards were inspected to determine their general rating in terms of cleanliness and appearance, as well as the specific shade of gray which the copper exhibited and the degree of "mottling." The term "mottling" refers to the amount of localized discoloration which occurs throughout the board. Generally, such localized discolorations or mottling indicate incomplete cleaning.

TABLE I

| Volume percent of 48% by wt. HBr | Immersion time (seconds) | Appearance of solder after cleaning: Shade of gray | Degree of mottling | General rating |
|---|---|---|---|---|
| 0.0 | 0 | Dark | Moderate | Poor. |
| 100.0 | 5 | Very light | None | Excellent. |
| 100.0 | 15 | do | do | Do. |
| 100.0 | 30 | do | do | Do. |
| 100.0 | 60 | do | do | Do. |
| 100.0 | 120 | do | do | Do. |
| 50.0 | 5 | do | do | Do. |
| 50.0 | 15 | do | do | Do. |
| 50.0 | 30 | do | do | Do. |
| 50.0 | 60 | do | do | Do. |
| 50.0 | 120 | do | do | Do. |
| 25.0 | 5 | do | do | Do. |
| 25.0 | 15 | do | do | Do. |
| 25.0 | 30 | do | do | Do. |
| 25.0 | 60 | do | do | Do. |
| 25.0 | 120 | do | do | Do. |
| 12.5 | 5 | do | do | Do. |
| 12.5 | 15 | do | do | Do. |
| 12.5 | 30 | do | do | Do. |
| 12.5 | 60 | do | do | Do. |
| 12.5 | 120 | do | do | Do. |
| 6.0 | 15 | Light | Slight | Very good. |
| 6.0 | 30 | Very light | None | Excellent. |
| 6.0 | 60 | do | do | Do. |
| 6.0 | 120 | do | do | Do. |
| 3.0 | 15 | Light | Slight | Fair. |
| 3.0 | 30 | do | do | Do. |
| 3.0 | 60 | Very light | Very slight. | Very good. |
| 3.0 | 120 | do | do | Do. |
| 1.5 | 60 | Light | Moderate | Good. |
| 1.5 | 120 | Very light | Very slight. | Very good. |
| 0.5 | 60 | Light | do | Good. |
| | 120 | do | do | Do. |

EXAMPLE 2

The procedure of example 1 was repeated, except that in some of the runs the cleaning formulations contained thiourea in addition to the hydrobromic acid. The amount of thiourea, hydrobromic acid, as well as the temperature of the solution and the immersion time, are set forth in Table II. The general appearance of the cleaned boards is also given in Table II.

TABLE II

| Volume % of 48% by wt. HBr | Thiourea (wt. %) | Temp. (°F.) | Immersion Time (seconds) | Solder appearance (general rating) |
|---|---|---|---|---|
| 10 | 0 | 100 | 60 | Very good |
| 10 | 2 | 100 | 60 | Very good |
| 10 | 4 | 100 | 60 | Very good |
| 10 | 6 | 100 | 60 | Excellent |
| 10 | 8 | 100 | 60 | Excellent |
| 10 | 10 | 100 | 60 | Excellent |
| 10 | 20 | 100 | 60 | Excellent |
| 10 126 | 0 | 100 | 5 | Fair |
| 10 | 0 | 100 | 15 | Good |
| 10 | 0 | 100 | 30 | Good |
| 10 | 0 | 75 | 60 | Very good |
| 10 | 0 | 100 | 60 | Very good |
| 10 | 0 | 120 | 60 | Very good |
| 10 | 10 | 100 | 60 | Excellent |
| 10 | 10 | 120 | 60 | Excellent |

EXAMPLE 3

The procedure of Example 1 was repeated, except that in this case the etched solder-resisted circuit boards were sprayed with the hydrobromic acid cleaning solution instead of merely being dipped. The concentration of the cleaning solution, the temperature of the solution and the spray time are all set forth in Table III, along with the appearance of the solder after cleaning.

EXAMPLE 4

Run A—Procedure of the Invention

A series of runs were made using the same type of test boards as set forth in Example 1, except that the etching was carried out with an etchant containing 2.0 pounds of ammonium persulfate, 3.5 ounces of dissolved copper and 5 p.p.m. of mercury diluted with water to make one gallon of etchant. The resultant, etched boards were then cleaned using the following formulation:

| | |
|---|---|
| hydrobromic acid (50% by weight) | 10% by volume of the cleaning solution |
| thiourea | 10% by weight of the cleaning solution |

The temperature of the cleaning solution was 100° F., and the immersion time was 60 seconds. The solder, after cleaning, had a very light shade of gray, had no mottling and had excellent solderability to other components.

Run B—Prior Art

The same procedure was followed as in Run A, except that the resultant, etched boards were cleaned using a fluoboric acid/thiourea formulation. This contained 378.5 ml. of 48 percent fluoboric acid, 378.5 g. of thiourea and 38.0 ml. of Triton X-100™, a nonionic surfactant, diluted with water to form one gallon of solution. This cleaner was maintained at 120° F., and

TABLE III

| Volume percent of 48% by wt. HBr | Thiourea (wt. percent) | Spray time (seconds) | Temp. (° F.) | Appearance of solder after cleaning: Shade of gray | Degree of mottling | General rating |
|---|---|---|---|---|---|---|
| 10 | 0 | 5 | 75 | Light | None | Very good. |
| 10 | 0 | 10 | 75 | do | do | Do. |

TABLE III – Continued

| Volume percent of 48% by wt. HBr | Thiourea (wt. percent) | Spray time (seconds) | Temp. (° F.) | Appearance of solder after cleaning | | |
|---|---|---|---|---|---|---|
| | | | | Shade of gray | Degree of mottling | General rating |
| 10 | 0 | 15 | 75 | do | do | Do. |
| 10 | 0 | 30 | 75 | do | do | Do. |
| 10 | 0 | 120 | 75 | do | do | Do. |
| 10 | 0 | 5 | 100 | do | do | Excellent. |
| 10 | 0 | 10 | 100 | do | do | Do. |
| 10 | 0 | 15 | 100 | do | do | Do. |
| 10 | 0 | 30 | 100 | do | do | Do. |
| 10 | 0 | 120 | 100 | do | do | Do. |
| 10 | 10 | 5 | 100 | Very light | do | Do. |
| 10 | 10 | 10 | 100 | do | do | Do. |
| 10 | 10 | 15 | 100 | do | do | Do. |
| 10 | 10 | 30 | 100 | do | do | Do. |
| 10 | 10 | 120 | 100 | do | do | Do. |

the boards were immersed therein for 90 seconds. The solder, after cleaning, had a dark shade of gray, had a slight degree of mottling, and had excellent solderability to other components.

Run C—Prior art

The procedure of Run A was repeated, except that the cleaning solution was made up of a hydrochloric acid solution. In this run the etched test boards were immersed for 3 minutes at 74° F. in a solution containing 10 percent by volume of concentrated hydrochloric acid in water. The solder, after cleaning, had a dark shade of gray, had a slight degree of mottling, and had excellent solderability to other components.

EXAMPLE 5

The procedure of Example 4, Run A, was repeated using an aqueous solution of 240 g. chromic acid and 180 g. of $H_2SO_4$ as the etchant, and substantially the same results were obtained as in Run A. A clean, light gray-colored solder, having no mottling, and excellent solderability was obtained.

Pursuant to the requirements of the patent statutes, the principle of this invention has been explained and exemplified in a manner so that it can be readily practiced by those skilled in the art, such exemplification including what is considered to represent the best embodiment of the invention. However, it should be clearly understood that, within the scope of the appended claims, the invention may be practiced by those skilled in the art, and having the benefit of this disclosure otherwise than as specifically described and exemplified herein.

What is claimed is:

1. Method of cleaning and brightening a lead-tin solder-resist of a printed circuit board which has been contacted with an etchant during the etching of said board, which comprises contacting said solder-resist with an aqueous solution containing an equivalent concentration of at least 0.5 volume percent of a 48 percent by weight hydrobromic acid at a temperature of at least 75° F. for at least about 5 seconds, and removing the cleaned and brightened solder-resisted board from contact with said solution.

2. Process of claim 1 wherein said etchant is an aqueous 0.75–1.25 M ammonium persulfate solution.

3. Process of claim 1 wherein the solder is an alloy consisting of from 40–80 percent by weight lead and 60–20 percent by weight tin.

4. Process of claim 1 wherein the temperature of said solution is from about 75°–120° F.

5. Process of claim 1 wherein said solution contains thiourea in amounts of from 1 to 20 percent by weight of said cleaning and brightening solution.

6. Process of claim 1 wherein the said solder-resist is contacted with said aqueous solution for from about 5 to about 120 seconds.

* * * * *